United States Patent [19]

Veltri et al.

[11] Patent Number: 4,472,476
[45] Date of Patent: Sep. 18, 1984

[54] COMPOSITE SILICON CARBIDE/SILICON NITRIDE COATINGS FOR CARBON-CARBON MATERIALS

[75] Inventors: Richard D. Veltri, East Hartford; Francis S. Galasso, Manchester, both of Conn.

[73] Assignee: United Technologies Corporation, Hartford, Conn.

[21] Appl. No.: 391,611

[22] Filed: Jun. 24, 1982

[51] Int. Cl.³ .................. C23C 11/00; C23C 11/08
[52] U.S. Cl. .................. 428/215; 428/408; 428/448; 428/450; 428/367; 428/366; 427/249; 427/228; 427/255.6
[58] Field of Search .............. 428/215, 408, 448, 450

[56] References Cited

U.S. PATENT DOCUMENTS

| | | | |
|---|---|---|---|
| 2,992,127 | 7/1961 | Jones | 428/408 |
| 3,095,316 | 6/1963 | Hartwig | 428/408 |
| 3,925,577 | 12/1975 | Fatzer | 428/408 |
| 4,029,844 | 6/1977 | Olcott | 428/408 X |
| 4,142,008 | 2/1979 | Debolt | 428/366 |
| 4,214,037 | 7/1980 | Galasso et al. | 428/408 X |

FOREIGN PATENT DOCUMENTS 2081695  2/1982  United Kingdom .............. 428/408

Primary Examiner—Patricia C. Ives
Attorney, Agent, or Firm—Charles E. Sohl

[57] ABSTRACT

A multilayer coating system for the protection of carbon-carbon composites is described. The coating includes an inner layer of SiC (produced by a conversion process in which Si is diffused into the carbon substrate) and an outer layer of CVD (chemically vapor deposited) $Si_3N_4$. Such a coating provides exceptional oxidation resistance, to 2500° F. (1371° C.) and above, for carbon-carbon materials. Optionally, preliminary coatings of CVD SiC or pyrolytic graphite can be applied prior to application of the inner layer of SiC.

9 Claims, 5 Drawing Figures

COMPOSITE SILICON CARBIDE/SILICON NITRIDE COATINGS FOR CARBON-CARBON MATERIALS

DESCRIPTION

1. Technical Field

This invention concerns coatings for carbon base materials, and particularly multilayer or composite coatings for carbon-carbon composite materials.

2. Background Art

Carbon-carbon composites are a class of unique materials whose properties, especially at elevated temperatures, make them attractive for various aerospace applications. The materials are composites although all of the composite elements are comprised essentially of carbon, in its various allotropic forms. Carbon-carbon materials are produced starting with organic precursor fibers such as polyacrylonitrile, rayon or pitch. Such fibers are usually produced in bundles (yarn), often by an extrusion process. The precursor fibers are heated in an inert atmosphere to pyrolyze or carbonize them and may then be heated to a higher temperature (e.g. 4000° F., 2204° C.) to form graphite fibers. These carbon or graphite materials may then be laid down, woven, or interleaved to form what are referred to as 1D, 2D, 3D, etc. structures where D stands for direction (i.e. in a 2D structure fibers are laid in two (usually orthogonal) directions).

These woven structures can then be impregnated with a pitch or resin material which is converted to carbon and then graphite. In this process, hot pressing is also employed to obtain a dense structure. Repeated impregnation steps can be employed to increase density.

An alternative processing scheme is to use chemical vapor deposition (CVD) to deposit pyrolytic graphite matrix.

The finished product is 90+% carbon, but by virtue of the fiber alignment and other processing details such as densification, has exceptional mechanical properties when compared with other carbon type materials. The mechanical properties are constant, or even increase slightly, with temperatures up to about 4000° F. (2204° C.). This temperature capability makes carbon-carbon materials exceptionally attractive for various aerospace applications including gas turbine engines. The obvious drawback is the susceptibility of carbon-carbon materials to oxidation. The present invention concerns a coating to protect carbon-carbon materials from catastrophic oxidation at temperatures up to at least 2500° F. (1371° C.).

It is known in the prior art to use SiC (silicon carbide) conversion coatings to protect carbon base materials, including carbon-carbon composites. Such coatings are termed conversion coatings because the surface of the article to be coated is converted to SiC by reacting it with silicon. Pack coating processes are popular. A carbon article can be embedded and heated in a pack material which will produce Si (silcon) or Si compound vapors when heated. U.S. Pat. Nos. 2,972,556 and 2,992,127 suggest the application of $Si_3N_4$ (silicon nitride) over non-pack derived SiC coatings.

It is an object of the invention to describe an improved multiple layer coating for the protection of carbon base substrates.

DISCLOSURE OF INVENTION

Carbon-carbon composite materials are coated to render them resistant to elevated temperature oxidation. A multilayer coating is employed. A first or inner layer of SiC is produced by diffusing Si into the carbon-base substrate. This layer has a thickness of from about 0.5 to about 30 mils. A second outer layer of $Si_3N_4$ having a thickness of from about 5 to about 25 mils is then applied by chemical vapor deposition. The composite coating provides exceptional oxidation resistance.

The foregoing, and other features and advantages of the present invention, will become more apparent from the following description and accompanying drawing.

BEST MODE FOR CARRYING OUT THE INVENTION

Figure 1:
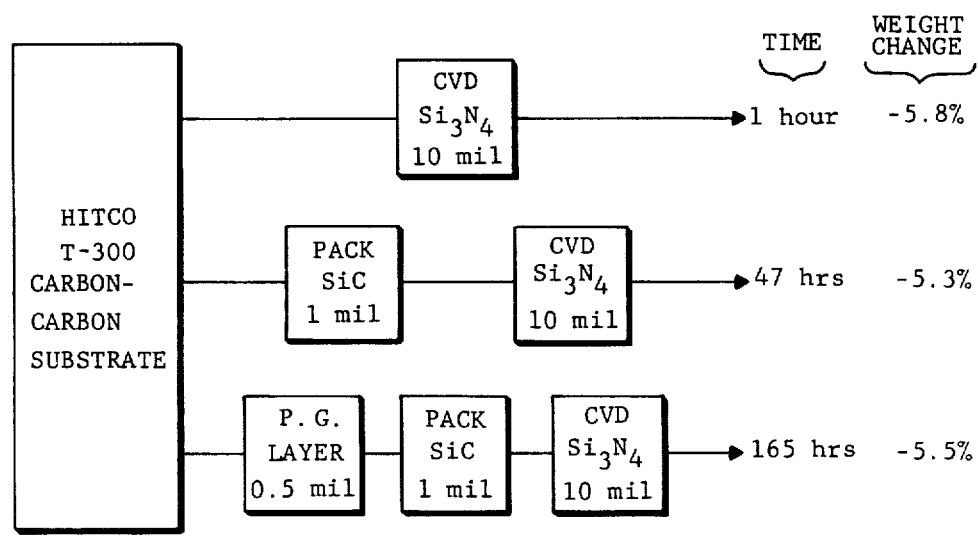
FIG. 1 is a flow chart describing different coating combinations applied to a carbon-carbon composite and the subsequent oxidation behavior.

Carbon-carbon composite materials are provided with exceptional elevated temperature oxidation resistance, by having a composite or multilayer protective coating applied to their exposed surfaces. The composite invention coating includes two essential components, an initial SiC conversion coating, for example, a pack applied coating, and a chemical vapor deposited $Si_3N_4$ coating over the SiC pack coating.

Carbon-carbon materials having such coatings have demonstrated virtual immunity to oxidation at temperatures up to 2500° F. (1371° C.), even after exposure for more than 500 hours.

The initial SiC conversion coating has a thickness of 0.5 to 30 mils and preferably 1 to 10 mils. Such a coating can be provided by surrounding the article to be coated with a pack powder mixture containing (nominally) 10% $Al_2O_3$, 60% SiC and 30% Si, and heating the pack (and article) at about 1600° C. for 2 to 10 hours. An improved SiC conversion coating results if 0.1% to 3% (and preferably 0.3% to 1.5%) boron is included in the pack mixture. This is described in commonly assigned application U.S. Ser. No. 391,613 entitled "Deposition of Improved SiC Coatings on Carbon Base Materials" by Galasso and Veltri, filed on even date herewith. We believe that other pack mixtures can be devised which will produce an equivalent SiC coating.

Having applied the SiC conversion coating, an outer coating of CVD $Si_3N_4$ is applied. The process described in commonly assigned U.S. Pat. No. 3,226,194 (which is incorporated by reference) is an exemplary process. Briefly, this patent describes a method for depositing pyrolytic silicon nitride on a substrate by maintaining the substrate at an elevated temperature, e.g. 1500° C., and passing a gaseous mixture containing $SiF_4$ over the substrate. Preferably, the gas contains about 75% ammonia and the partial pressure of the reactant gases is maintained less than about 100 mm of mercury.

The $SiF_4$, other silicon halides or silane, can be reacted with $NH_3$ or $N_2$ on the hot substrate surfaces to produce an amorphous or $\alpha$ $Si_3N_4$ coating. While the $SiF_4$-$NH_3$ reaction is best performed at 1400° C. to 1600° C., the reaction of silane with nitrogen containing gases can be run at lower temperatures. These processes may readily be used to apply silicon nitride to carbon-carbon materials which have previously received a SiC conversion coating. For the purposes of this invention, a coating thickness of about 3 to 30 mils, and preferably 10 to 20 mils is employed. The coated article thus produced is adapted to resist oxidation under severe conditions.

An added coating constituent, a preliminary layer of pyrolytic graphite can be applied to the carbon-carbon composite prior to applying the SiC conversion coating in certain circumstances. Such a layer, having a thickness of 1 to 5 mils may be produced by flowing a mixtures of gases ($CH_4$ and argon in a 4:1 ratio) over the surface while the surface is heated to a temperature of about 1800° C. in a reaction chamber which is maintained at a pressure of 10–25 Torr.

Such a pyrolytic graphite coating is especially useful in connection with substrates which are not 100% dense, do not have a pyrolytic graphite matrix, and on those substrates having a positive coefficient of thermal expansion. The graphite layer provides a uniform surface condition so that a SiC conversion coating of uniform quality can be produced minimizing differences in starting materials. The concept of using an initial pyrolytic graphite layer when coating carbon-carbon composites is described in commonly assigned copending application Ser. No. 391,614, now abandoned by Veltri and Galasso entitled "Pyrolytic Graphite Pretreatment for Carbon-Carbon Composites", filed on even date herewith.

Alternatively, a thin layer of CVD SiC may be applied as an initial layer prior to applying the SiC conversion coating by the pack process described above. Such a layer provides substantial benefits when coating substrates having a negative coefficient of thermal expansion.

Preferred conditions for depositing CVD SiC on the surface of the carbon-carbon material are to heat the substrate to a temperature of between 1000° C. and 1200° C. while maintaining the substrate in a reduced pressure chamber at a pressure of 2–20 Torr while flowing a mixture of methane, hydrogen, and methyldichlorosilane over the surface of the sample. The preferred ratio of methane to hydrogen to methyldichlorosilane is about 100:100:14 (although ratios of about 60–140:60–140:10–20 appear feasible). In the case of a small chamber having a 2 inch (5.08 cm) inside diameter and a 4 inch (10.2 cm) length, 100 cc/min of $CH_4$ and $H_2$ 13.6 cc/min of methyldichlorosilane were flowed through the chamber to produce the desired coating. A coating of from 0.1 to 5 mils and preferably 0.5 to 3 mils can be produced in about 1–4 hours under the described conditions. As in the case of the pyrolytic graphite preliminary layer, the thickness of the subsequently deposited SiC conversion layer preferably exceeds the thickness of the CVD SiC layer.

The use of a preliminary CVD SiC coating is the subject of commonly assigned U.S. patent application Ser. No. 391,615, now U.S. Pat. No. 4,425,407 entitled "CVD SiC Pretreatment in the Coating of Carbon-Carbon Composites" by Galasso and Veltri, filed on even date herewith.

FIG. 1 illustrates the performance benefits which result from various coatings. A simple CVD $Si_3N_4$ coating was relatively ineffective in reducing oxidation at 2000° F. (1093° C.), permitting a weight loss of 5.8% in 1 hour. Adding the pack SiC coating prior to the CVD $Si_3N_4$ coating substantially improved the protection; a 47 hour exposure produced a weight loss of about 5.3%. Adding a preliminary pyrolytic graphite layer increased the protective capability so that an exposure of 165 hours resulted in a weight loss of 5.5%.

Figure 2:
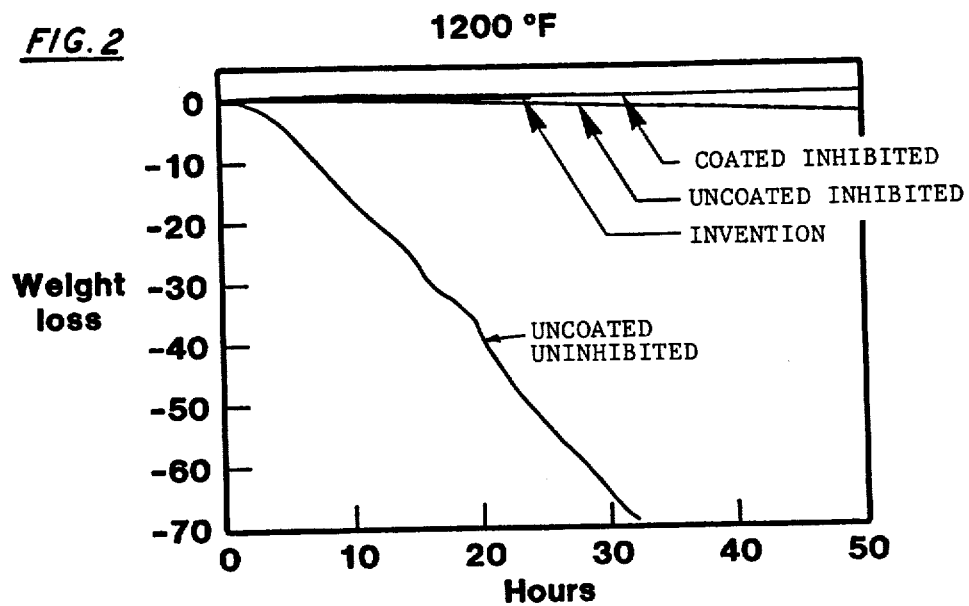
FIGS. 2,3,4 and 5 show the oxidation behavior of inhibited carbon-carbon composites coated according to the present invention.
Figure 3:
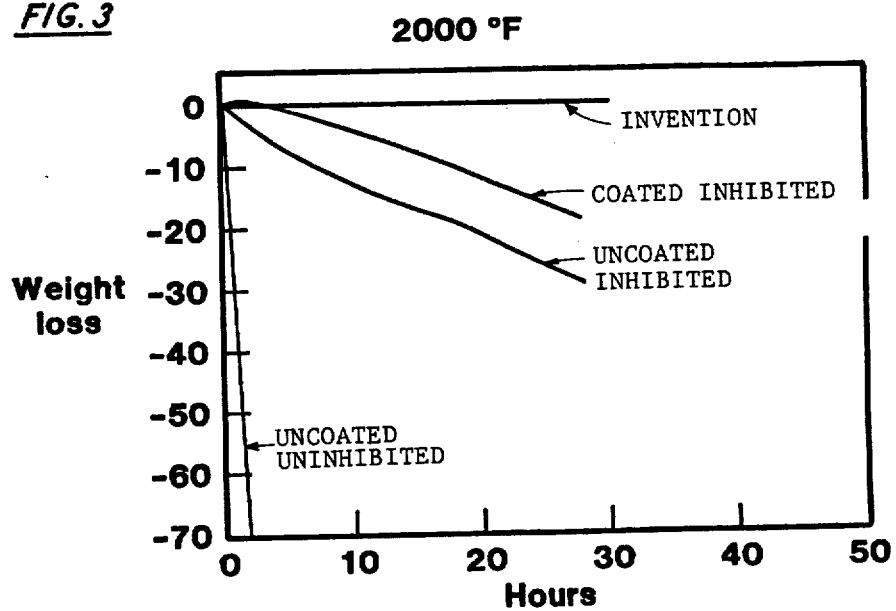
Figure 4:
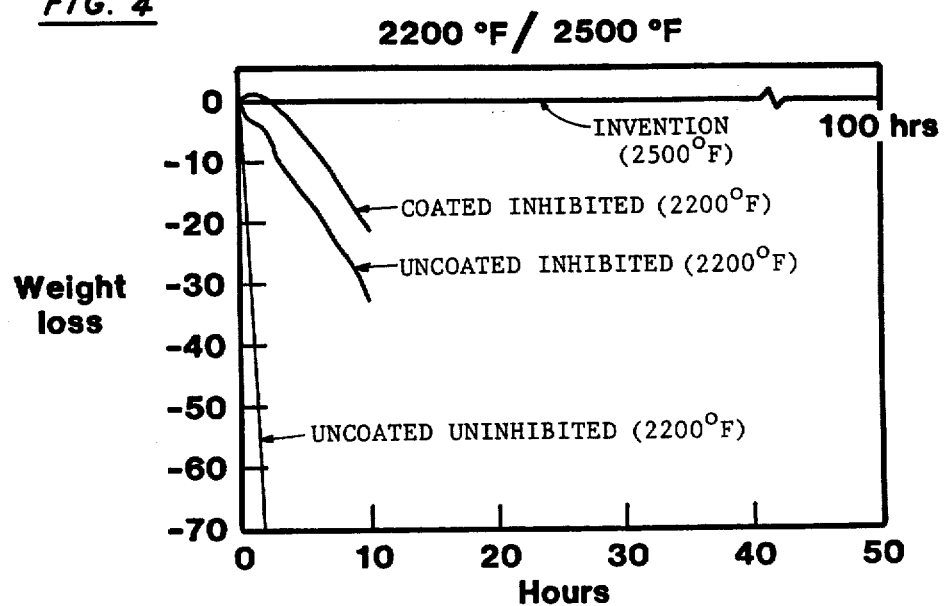

FIGS. 2, 3 and 4 show the oxidation behavior of inhibited carbon-carbon samples with various coatings, along with a curve showing the behavior of an uncoated uninhibited specimen. Inhibited carbon-carbon materials contain additives which reduce the inherent oxidation rate of the sample. The material whose behavior is shown in FIGS. 2, 3 and 4 is a proprietary material prepared by the HITCO Corp. whose principal inhibiting additives are believed to be tungsten and/or boron. FIGS. 2, 3 and 4 show oxidation behavior at 1200° F. (649° C.), 2000° F. (1093° C.) and 2200° F./2500° F. (1204° C./1371° C.), respectively. Each figure includes a curve for a base-line uncoated uninhibited sample, a curve for an uncoated inhibited sample, a curve for an inhibited sample with a proprietary state of the art coating (believed to be a pack coating), and a curve depicting the behavior of an inhibited sample which had been given a coating according to the present invention. The details of the invention coating are as follows: an initial layer 1 to 2 mils thick of pyrolytic graphite was applied as an initial step. Next, a silicon carbide layer was prepared using a pack diffusion process (3 to 5 mils thick) and finally a CVD process was used to apply 5 to 10 mils of $Si_3N_4$. A review of FIGS. 2, 3 and 4 shows that in all cases, the invention coating was superior to all others tested. At the higher temperatures, the superiority of the invention becomes increasingly evident. Note in particular, how the prior art coatings undergo substantially more oxidation weight loss at 2200° F. (1204° C.) than at 2000° F. (1093° C.), and note further that the invention coating was tested at 2500° F. (1371° C.) and compared to the prior art at 2200° F. ((1204° C.).

Figure 5:
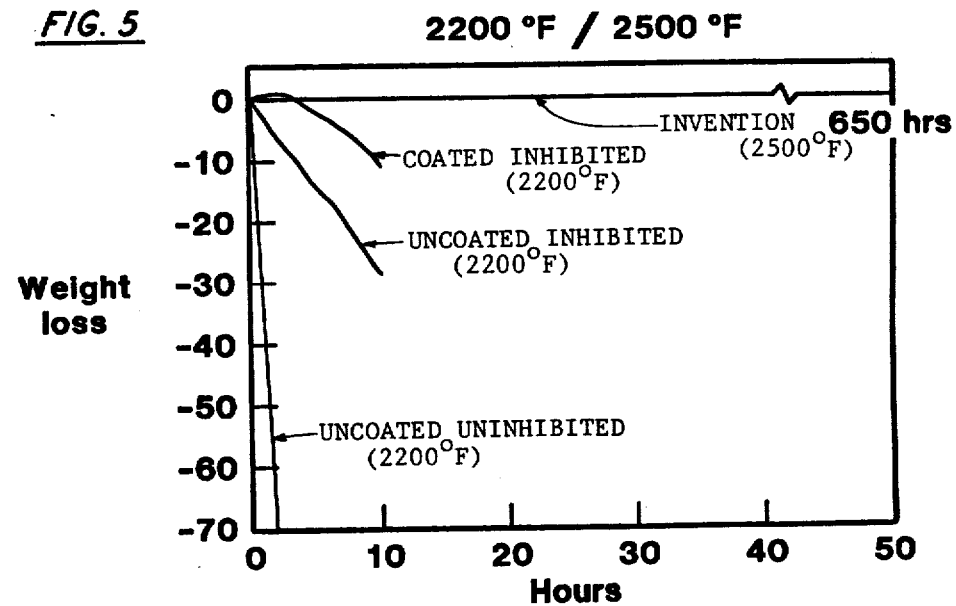

FIG. 5 is a plot similar to FIG. 4 except that a different type of inhibited carbon-carbon substrate was employed. Note also that the invention coating was tested for the unprecedented time of 650 hours at 2500° F. (1371° C.) without displaying any sign of significant weight loss.

Although this invention has been shown and described with respect to detailed embodiments thereof, it will be understood by those skilled in the art that various changes in form and detail thereof may be made without departing from the spirit and scope of the claimed invention.

We claim:
1. A carbon-carbon composite article adapted to resist environmental degradation at elevated temperatures which comprises:
   a. a carbon-carbon substrate;
   b. a pack derived SiC coating integral with the substrate surface having a thickness of from about 0.5 to 30 mils; and
   c. a CVD applied layer of $Si_3N_4$ on the outer surface of the SiC layer having a thickness of from about 3 to 30 mils.

2. A carbon-carbon composite article adapted to resist environmental degradation at elevated temperatures which comprises:
   a. a carbon-carbon substrate;
   b. a layer of pyrolytic graphite having a thickness of from about 1 to about 5 mils;
   c. a pack derived SiC coating integral with the substrate surface having a thickness of from about 0.5 to about 30 mils; and d. a CVD applied layer of Si₃N₄ on the outer surface of the SiC layer having a thickness of from about 3 to about 30 mils.

3. A carbon-carbon composite article adapted to resist environmental degradation at elevated temperatures which comprises:
 a. a carbon-carbon substrate;
 b. a layer of CVD applied SiC having a thickness of from about 0.5 to about 5 mils;
 c. a pack derived SiC coating integral with the substrate surface having a thickness of from about 0.5 to about 30 mils; and
 d. a CVD applied layer of Si₃N₄ on the outer surface of the SiC layer having a thickness of from about 3 to about 30 mils.

4. An article as in claims 1, 2 or 3 in which the pack derived SiC coating contains a small but effective quantity of B.

5. An article as in claims 1, 2 or 3 in which the SiC coating has a thickness of from about 1 to about 10 mils.

6. An article as in claims 1, 2 or 3 in which the Si₃N₄ coating has a thickness of from about 5 to about 20 mils.

7. An article as in claim 1 in which the pack derived SiC coating is derived from a pack which contains from about 0.1 to about 3% boron.

8. An article as in claim 2 in which the pack derived SiC coating is derived from a pack which contains from about 0.1 to about 3% boron.

9. An article as in claim 3 in which the pack derived SiC coating is derived from a pack which contains from about 0.1 to about 3% boron.

* * * * *